United States Patent
Yokoyama et al.

(10) Patent No.: US 6,284,661 B1
(45) Date of Patent: *Sep. 4, 2001

(54) METHOD AND APPARATUS FOR PRODUCING A WAFER

(75) Inventors: Takashi Yokoyama; Kazuma Yamamoto; Masato Yamamoto; Takahiro Mishima; Go Matsuda; Shigeki Itou, all of Osaka (JP)

(73) Assignee: Daido Hoxan Inc., Sapporo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/833,125

(22) Filed: Apr. 4, 1997

(30) Foreign Application Priority Data

Apr. 4, 1996 (JP) .................................................. 8-082423

(51) Int. Cl.⁷ ............................... B28D 5/00; C30B 33/12
(52) U.S. Cl. ........................... 438/706; 216/17; 156/345; 83/117; 234/46
(58) Field of Search ............................ 156/345; 438/460, 438/706, 719; 216/17, 58, 79; 250/251; 408/701; 83/53, 177; 234/46

(56) References Cited

U.S. PATENT DOCUMENTS

| | | | |
|---|---|---|---|
| 2,533,311 | * 12/1950 | Chelborg et al. ....................... | 266/72 |
| 4,465,550 | 8/1984 | Lane ...................................... | 438/460 |
| 4,619,318 | * 10/1986 | Terrell et al. ............................ | 166/55 |
| 4,774,416 | * 9/1988 | Askary et al. ...................... | 250/492.2 |
| 4,776,316 | * 10/1988 | Ashkenazi ............................... | 125/18 |
| 4,960,495 | * 10/1990 | Mori et al. .............................. | 216/65 |
| 5,076,877 | * 12/1991 | Ueda et al. ........................... | 156/345 |
| 5,350,480 | * 9/1994 | Gray ...................................... | 156/345 |
| 5,715,806 | * 2/1998 | Tonegawa et al. ................ | 125/16.02 |
| 5,716,876 | * 2/1998 | Muramatsu ............................. | 438/14 |

FOREIGN PATENT DOCUMENTS

| | | |
|---|---|---|
| 0 300 224 A | 1/1989 | (EP) . |
| 0 477 698 A1 | 4/1992 | (EP) . |
| 6-328400 | * 11/1994 | (JP) ................................. B26F/3/00 |

OTHER PUBLICATIONS

Patent Abstracts of Japan, vol. 095, No. 002, Mar. 31, 1995 & JP 06 328400 A (Niigata Eng Co. Ltd) Nov. 29, 1994.
Suzuki, Keizo et al., "Anisotropic etching of polycrystalline silicon with a hot C12 molecular beam", Journal of Applied Physics, vol. 64 No. 7, pp. 3697–3705.*

* cited by examiner

*Primary Examiner*—Benjamin Utech
*Assistant Examiner*—Donald L. Champagne
(74) *Attorney, Agent, or Firm*—Armstrong, Westerman, Hattori, McLeland, & Naughton

(57) ABSTRACT

A method and an apparatus for cutting a wafer from a crystalline ingot, by directing a stream or streams of etching gas at the crystalline ingot in a vacuum. Waste in cutting can be greatly minimized and the work environment can also be kept clean. Further, excellent surface smoothness can be realized on the cut wafers.

7 Claims, 2 Drawing Sheets

METHOD AND APPARATUS FOR PRODUCING A WAFER

FIELD OF THIS INVENTION

The present invention relates to a method and apparatus for producing a wafer.

BACKGROUND OF THE INVENTION

A wafer employed for producing various kinds of semiconductor devices can generally be obtained by cutting out a crystalline ingot such as Si or GaAs at specific intervals so as to form plates and mirror polishing their surfaces.

A diamond blade saw or a wire saw for metal cutting has heretofore been employed for cutting a crystalline ingot. Namely, an ingot is cut out with impact caused by pressing a diamond blade rotating at a high speed or a wire vibrating at a high speed thereon.

However, there is a problem in cost effectiveness in the above cutting method because it is impossible to cut out only the part cut into by a diamond blade or a wire since the adjacent area of the cut is deformed or destroyed so that an extra space of a sizable thickness is wasted. More specifically, a thickness of about 500 μm is wasted when a piece of wafer is cut out, which means about 50% of an ingot may be wasted when cutting out a wafer of 500 μm in thickness.

In addition, as such tools are repeatedly used in the cutting processes, the edge may be nicked or seizing may be caused, and then the sharpness may deteriorate, so that a diamond blade, a wire, or the like requires time-consuming work of periodical replacement.

Further, there is another problem in that cutting fluid is charged into portions to be cut for cooling and lubrication, and debris caused in a cutting process may scatter, resulting in deterioration of the work environment. Still further, it is difficult to recycle or dispose of the cutting fluid including the debris because a troublesome process, i.e., separation of the debris and the cutting fluid, is required.

Accordingly, it is an object of the present invention to provide a superior method and apparatus for producing a wafer hygienically and easily whereby waste can be minimized in the cutting process.

To accomplish the above objects, a first embodiment of the present invention provides a method for producing a wafer from a crystalline ingot comprising: supplying an etching gas which shows a high etching property for at least one constituent of the crystalline ingot, in a state of a molecular beam stream on a predetermined part of the crystalline ingot to be processed, volatilizing the predetermined part gradually from the surface of the ingot, and finally removing the predetermined part entirely to cut the wafer from the ingot.

A second embodiment of the present invention provides a method according to the first embodiment, wherein the etching gas comprises at least one component which is selected from the group consisting of $ClF_3$, $NF_3$, $CCl_2F_2$, $CF_4$, $C_2F_6$, $C_3F_8$, $CHF_3$, $CCl_4$, $SF_6$, $CCl_3F$ and HCl.

A third embodiment of the present invention provides a method according to the first or second embodiments, wherein the etching gas is supplied on the predetermined part of the crystalline ingot under a low pressure in the range of 1 to $10^{-6}$ Torr.

The present invention also provides an apparatus for producing a wafer from a crystalline ingot comprising a closed chamber provided with a supporting member for mounting the crystalline ingot and means for holding the wafer cut from the crystalline ingot, means for evacuating the chamber, and means for supplying an etching gas which shows a high etching property for a constituent of the crystalline ingot, in a state of a molecular beam stream on a predetermined part of the crystalline ingot to be processed, which is mounted on the member for mounting the crystalline ingot.

In another embodiment of the apparatus of the present invention, wherein the crystalline ingot to be cut is prismatic, an injector having plural slits formed in parallel is provided to a side of the prismatic ingot, and the etching gas is injected from each of the slits simultaneously so as to cut simultaneously plural wafers.

In the method of the invention, at least one constituent (for example, silicon atoms) of a crystalline ingot enters into a chemical reaction as a result of repeated collisions with atoms or molecules of etching gas, and consequently separates from the ingot surface. "An etching gas exhibiting a high etching property" herein means an etching gas exhibiting a property such that the number of required collisions of the atoms or molecules of etching gas with the constituent of the crystalline ingot to separate the constituent of the crystalline ingot is relatively small, specifically within 10 times. On the other hand, a conventional etching gas ($BCl_3$, $SiCl_4$, $Br_2$ or the like) requires several tens to 100 collisions to cause the separation. Thus there is a great difference in property between an etching gas showing a high etching property and a conventional etching gas.

SUMMARY OF THE INVENTION

The present invention is described in further detail below.

First, the crystalline ingot in the present invention can be various kinds of crystalline ingots heretofore employed as wafer materials. For example, there are crystalline ingots formed by a monocrystal or a polycrystal of Si, GaAs, $SiO_2$, $Si_3N_4$, $Al_2O_3$, or the like. Although the shapes of the crystalline ingots are not limited specifically, they are normally cylindrical or prismatic.

As an etching gas for cutting the crystalline ingot, a gas must be used which shows a high etching property for at least one constituent of the crystalline ingot (referred to as "the high-etching gas" hereinafter). As the high-etching gas, those etching gases mentioned above with an etching probability of not less than 10%, calculated from the number of collisions with the constituent of the crystalline ingot, for example, $ClF_3$, $NF_3$, $CCl_2F_2$, $CF_4$, $C_2F_6$, $C_3F_8$, $CHF_3$, $CCl_4$, $SF_6$, $CCl_3F$, HCl and the like are usable. However, the etching property of these gases also depends on the material of the ingot to be etched. These gases may not necessarily exhibit a high etching property for every type of ingot material. These gases may be employed alone or in combination of two or more such gases. The etching speed (as measured by the decrease in thickness of an ingot per unit of etching time) of $ClF_3$ on silicon atoms is approximately 50 μm per minute at atmospheric pressure and 100° C., which is very fast. The probability of the etching by $ClF_3$ can be obtained from the above etching speed and the number of collisions between $ClF_3$ gas molecules and silicon atoms (as calculated from the kinetic speed of the $ClF_3$ gas molecules), and is approximately ½, which is very high.

However, the width of the cuts through the crystalline ingot cannot be minimized if the above high-etching gas is used in a conventional manner. Namely, if the high-etching gas is employed for etching as in a conventional manner, the gas molecules collide with the ingot surface at random, so that etching is conducted widthwise as well as lengthwise simultaneously as shown in FIG. 3. As a result, not only the desired part but also adjacent areas are etched. This phenomenon is called "under etching".

If, in accordance with the present invention, the high-etching gas is supplied to the crystalline ingot in the state of a molecular beam stream, wherein the mean free path of the gas molecules increases, "under etching" is minimized and wafers can be cut out effectively. To obtain the molecular beam stream, it is preferable to provide the supply of the high-etching gas in an environment of a vacuum of 1 to $10^{-6}$ torr.

As mentioned above, when the high-etching gas is supplied to the crystalline ingot in the state of the molecular beam stream, the gas molecules collide with the surface of the ingot 2 linearly as shown in FIG. 4 in such a manner that a groove 1 is formed on the surface by etching at a high probability, for example, ½. In the meantime, another ½ of the remaining non-reacted gas reacts with the side wall or one groove 1 at a probability of ½, which results in etching of a ¼ probability [(½)×(½)=¼] of the total, which is not so high. Furthermore, the degree of etching in the side wall is low and hardly causes any problem, because the position where the gas molecules rebound against the side wall slides further downward as the depth of the groove increases as a result of the etching. Therefore, etching can be conducted within a limited area deeply, without wide-range "under etching" as shown in FIG. 3.

BRIEF DESCRIPTION OF THE DRAWINGS

The invention will be more fully described, in reference to the appended drawings, in which.

DESCRIPTION OF THE PREFERRED EMBODIMENTS

The following is a detailed description of the embodiments of the present invention.

Figure 1:
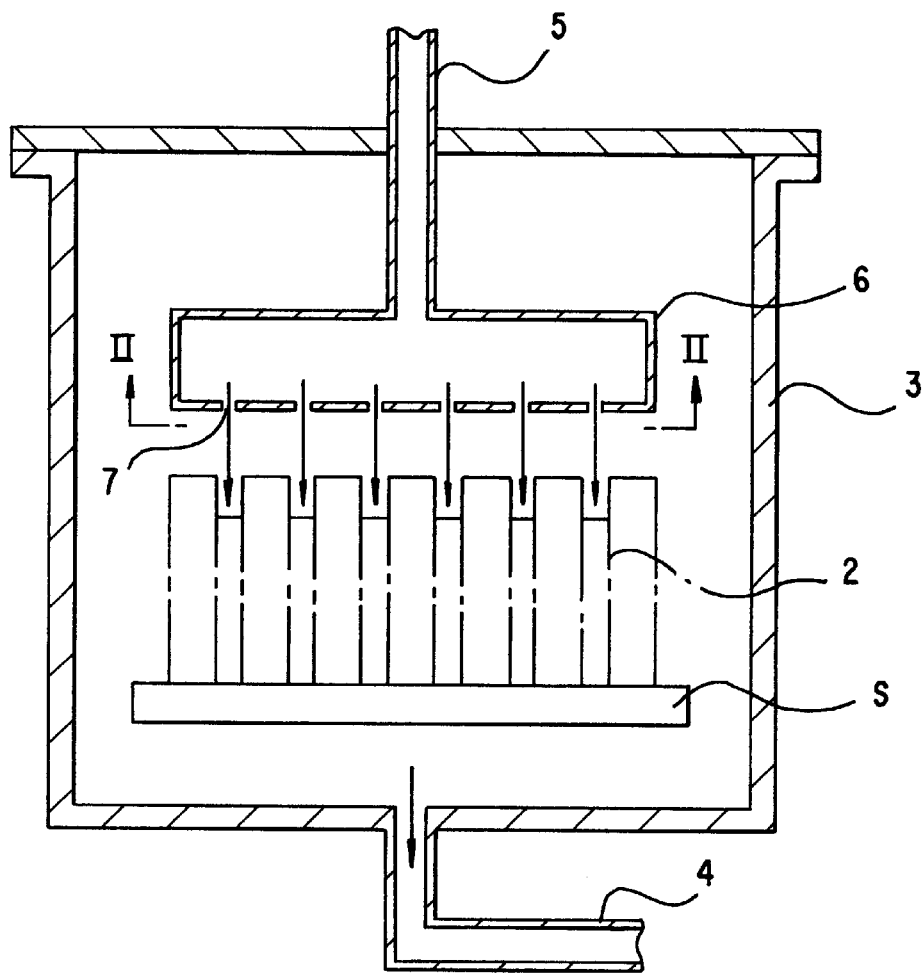
FIG. 1 is a schematic view of an apparatus of one embodiment according to the present invention.

FIG. 1 illustrates one embodiment of an apparatus used in a method for obtaining a wafer from a prismatic crystalline ingot 2 according to the present invention. In this apparatus, 3 is a closed chamber wherein a prismatic crystalline ingot 2 (abbreviated as "ingot" hereinafter) can be supported on its side by support means S for mounting an ingot. The apparatus also is provided with means for holding wafers (not shown) cut out of the ingot 2, and means for removing the cut wafers (not shown) from the chamber 3.

An exhaust tube 4 for evacuating the chamber 3 is connected to a bottom wall of the chamber 3, whereby an appropriate degree of vacuum can be established in the chamber 3.

An inlet tube 5 for introducing a high-etching gas to cut the ingot 2 extends into the chamber 3 from outside through the ceiling. An injector 6 is provided at the end of the inlet tube 5 so that the high-etching gas is injected toward the upper surface of the ingot 2 (or one side in case of a prismatic ingot).

Figure 2:
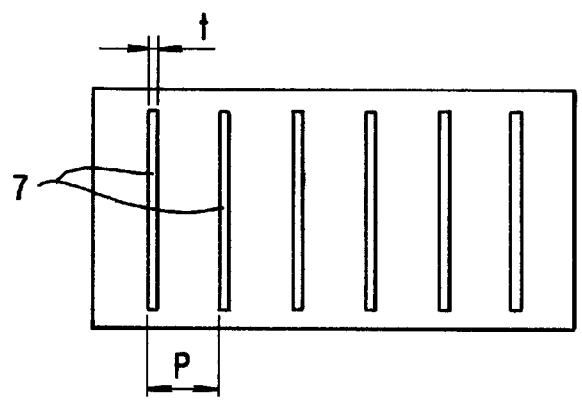
FIG. 2 is a view in the direction of the arrow II—II in FIG. 1.
Figure 3:
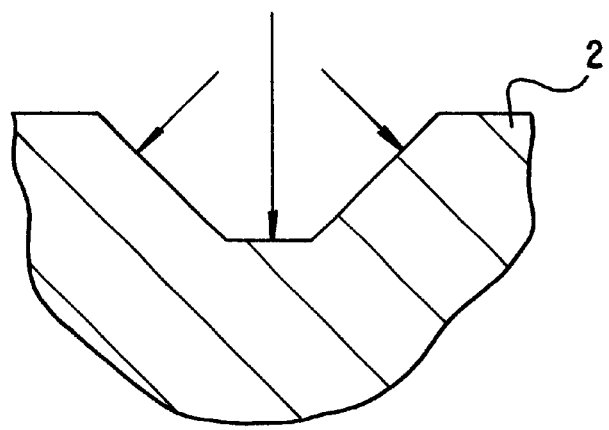
FIG. 3 is an explanatory view of a normal etching mode.

The outlets of the injector 6 are preferably formed by plural slits 7 positioned in parallel at equal intervals as shown in FIG. 2, which is a view in the direction of the arrow II—II in FIG. 1. The width "t" of a slit 7 is normally set within a range of 10 to 100 μm. The interval "P" between the slits 7 is set at a size equal to the thickness of a desired wafer plus α (for extra space), and is usually set within a range of 200 to 500 μm.

With use of the above apparatus, wafers can be cut out, for example, in the following manner. First, a prismatic ingot 2, such as an ingot made of Si monocrystal, is mounted on support means S in the chamber 3. The chamber 3 is evacuated through the exhaust tube 4 and $ClF_3$ gas is introduced therein through the inlet tube 5 so that the pressure in the chamber 3 is on the order of 1 to $10^{-6}$ torr.

Figure 4:
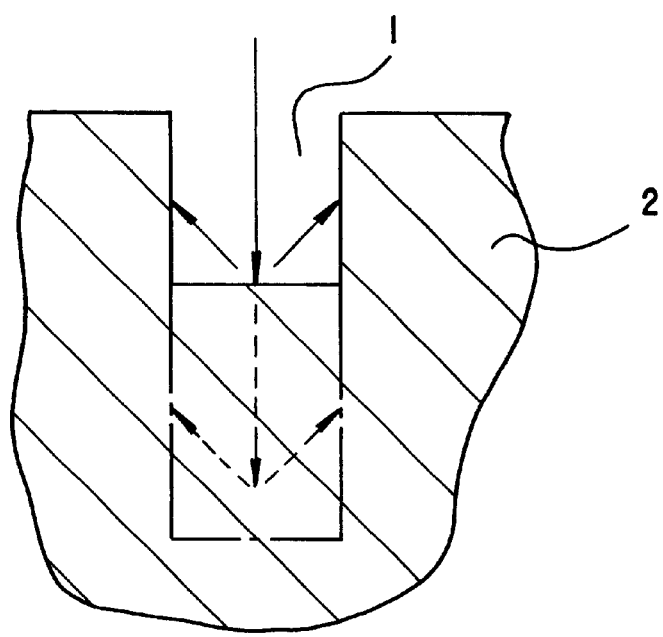
FIG. 4 is an explanatory view of an etching mode according to the present invention.

The $ClF_3$ gas is injected toward the upper surface of the ingot 2 from each slit 7 of the injector 6 as shown by the arrows in FIG. 1. The injection stream of the $ClF_3$ gas is supplied on the upper surface of the ingot 2 in the state of a molecular beam stream since the pressure in the chamber 3 is set at a high vacuum. For this reason, the $ClF_3$ gas proceeds straight without diffusion and collides with a limited zone corresponding to each slit 7. In that zone, Si as a constituent of the ingot 2 and the $ClF_3$ gas are reacted as follows so that the upper surface of the ingot 2 can be etched so as to be shaped into grooves (as shown in FIG. 4).

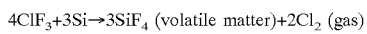

$4ClF_3 + 3Si \rightarrow 3SiF_4$ (volatile matter) $+ 2Cl_2$ (gas)

Therefore, the grooves in approximately the same width as the slit 7 are formed at the same intervals as those of the slits 7, and are shaved deeply by degrees so that the predetermined part to be cut can be etched finally as shown by the chain lines in FIG. 1, whereby plural wafers can be cut simultaneously. The thus obtained wafers are removed from the chamber 3.

Since the high-etching gas ($ClF_3$) is supplied in the state of a molecular beam stream from each slit 7 of the injector 6 over the upper surface of the ingot 2 so that only predetermined parts, or cut material, can be volatilized and removed in the limited width according to the above apparatus, volatilization of adjacent areas can be greatly decreased compared with the prior methods, resulting in minimizing waste of the ingot in cutting. Further, a very smooth cut surface is formed. Still further, the work environment is clean and hygienic because cutting fluid or debris is not scattered, which is a difference from the prior methods. Furthermore, the present invention realizes good workability without tool replacement.

In addition, plural slits 7 may be provided in the injector 6 in the above description in such a manner that plural wafers are cut simultaneously. However, it is acceptable to use only one slit at the end of the injector 6, whereby one area of the ingot 2 can be cut. In this case, the above cutting process is conducted from one end of the ingot 2, and then at least one of the injector 6 or the ingot 2 is moved relative to the other by one thickness of a piece of wafer every time a cutting process for one piece has been completed, whereby wafers can be consecutively cut.

A prismatic ingot was employed as the ingot 2 in the above description. However, the shape of the ingot 2 is not limited thereto and a cylindrical one is also acceptable.

As mentioned above, the present invention relates to a method wherein a high-etching gas is supplied in the state of a molecular beam stream on an ingot surface so that a gas constituent of the high-etching gas and at least one constituent of the ingot are chemically reacted, whereby the predetermined part on the surface of the ingot is volatilized and removed, in contrast to prior methods wherein wafers were heretofore cut from an ingot by a mechanical cutting method. According to the method of the invention, since the high-etching gas is supplied over the upper surface of the ingot 2 in the limited width so that the predetermined parts can be volatilized and removed in the limited width, volatilization of adjacent areas of the ingot can be greatly decreased compared with the prior methods, resulting in minimizing waste in cutting. Further, the work environment is clean and hygienic because cutting fluid or debris is not scattered, which is a difference from the prior methods. The present invention also realizes good workability without tool replacement. Since the thus obtained wafer is excellent in its surface smoothness unlike the wafers obtained by prior cutting methods, surface polishing is unnecessary or can be shortened, if any polishing is performed, according to the present invention. The above method can be performed effectively by using the apparatus of the present invention.

What is claimed is:

1. A method for cutting a wafer from a crystalline ingot exclusively by etching, comprising:

supplying an etching gas for at least one constituent of the crystalline ingot, in a state of a molecular beam stream on the part of the crystalline ingot to be cut;

volatilizing the cut material gradually from the surface of the ingot; and removing the cut material entirely so as to cut a wafer from the ingot.

2. The method according to claim 1, wherein the etching gas comprises at least one component selected from the group consisting of $ClF_3$, $NF_3$, $CCl_2F_2$, $CF_4$, $C_2F_6$, $C_3F_8$, $CHF_3$, $CCl_4$, $SF_6$, $CCl_3F$ and HCl.

3. The method according to claim 1, wherein the etching gas is supplied on the part of the crystalline ingot to be cut under a pressure in the range of 1 to $10^{-6}$ torr.

4. The method according to claim 2, wherein the etching gas is supplied on the part of the crystalline ingot to be cut under a pressure in the range of 1 to $10^{-6}$ torr.

5. The method according to claim 1, wherein a spaced plurality of supplies of the etching gas, in a state of molecular beam streams, are supplied on those spaced parts of the crystalline ingot to be cut and a plurality of wafers are simultaneously cut from the wafer.

6. The method according to claim 1, wherein a single supply of the etching gas, in a state of a molecular beam stream, is supplied on the crystalline ingot and at least one of the ingot or an injector for said single supply of etching gas is moved relative to the other to cut consecutively a plurality of wafers from the ingot.

7. The method according to claim 1, wherein said ingot is a prismatic ingot of Si monocrystal and said etching gas is $ClF_3$.

* * * * *